United States Patent [19]

Harnden, Jr.

[11] 3,742,420

[45] June 26, 1973

[54] PROTECTIVE ELECTRICAL FEED-THROUGH ASSEMBLIES FOR ENCLOSURES FOR ELECTRICAL DEVICES

[76] Inventor: John D. Harnden, Jr., 1078 Parkwood Boulevard, Schenectady, N.Y. 12308

[22] Filed: Oct. 21, 1971

[21] Appl. No.: 191,167

[52] U.S. Cl. .................... 338/21

[51] Int. Cl. .................... H01c 7/12

[58] Field of Search .................... 338/13, 20, 21; 317/238; 252/461; 339/222, 147

[56] References Cited

UNITED STATES PATENTS 2,075,733 3/1937 Lazarus .................... 338/20

*Primary Examiner*—C. L. Albritton

*Attorney*—John F. Ahern and Julius J. Zaskalicky

[57] ABSTRACT

A wafer of metallic oxide varistor material having a pair of opposed surfaces is provided with a plurality of apertures, each extending through the wafer from one opposed surface to the other opposed surface thereof. Each of the apertures are adapted to receive a respective conductive electrode of an electrical device and provide conductive contact between each of the electrodes and the wafer. The material has an alpha in excess of 10 when the current is of the current density range of $10^{-3}$ to $10^{2}$ amperes per square centimeter. The proportions of the apertures of the wafer in contact with the electrodes are spaced to provide a current flow between a pair of electrodes which is low when normal operating voltages appear across the pair of electrodes and when voltages in excess of the normal voltage appear across the electrodes a rapidly decreasing impedance is presented by the wafer in accordance with the alpha of the material of the wafer thereby limiting the voltage across the electrodes.

4 Claims, 6 Drawing Figures

PATENTED JUN 26 1973
3,742,420
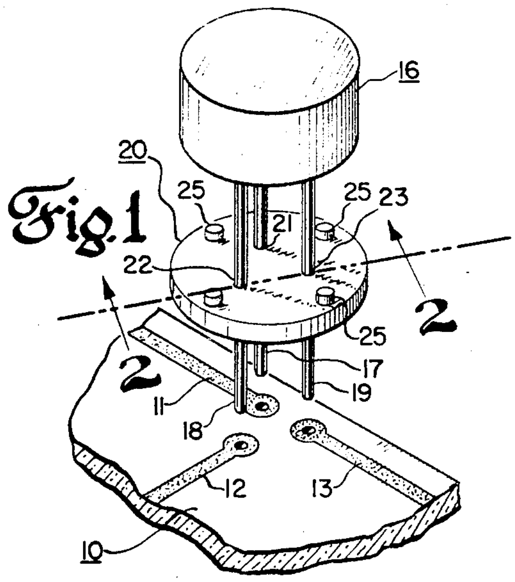
Fig.1
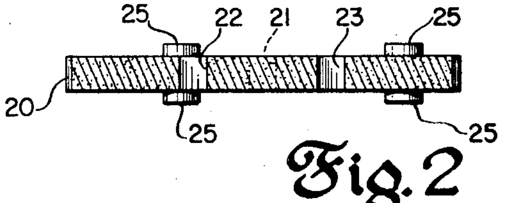
Fig.2
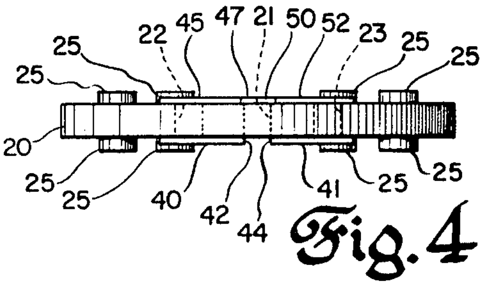
Fig.4
Fig.3
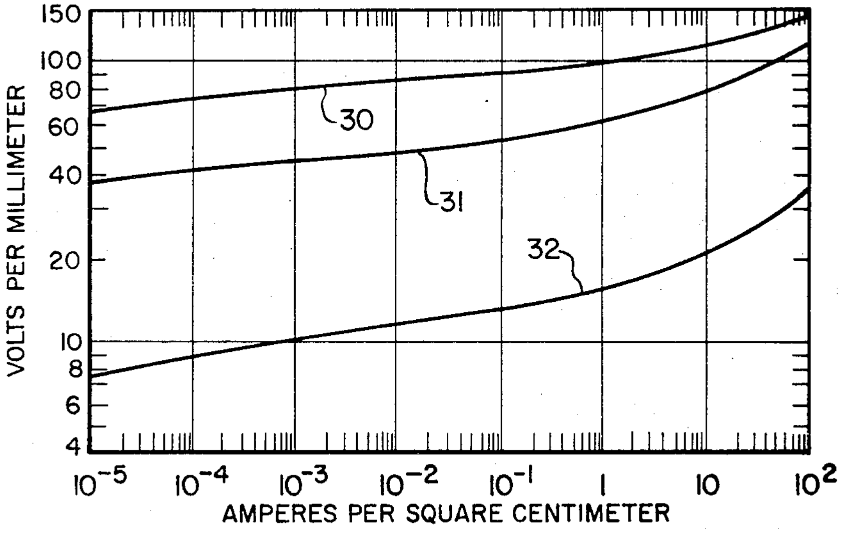
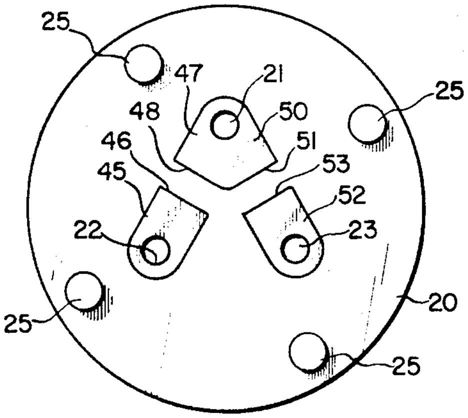
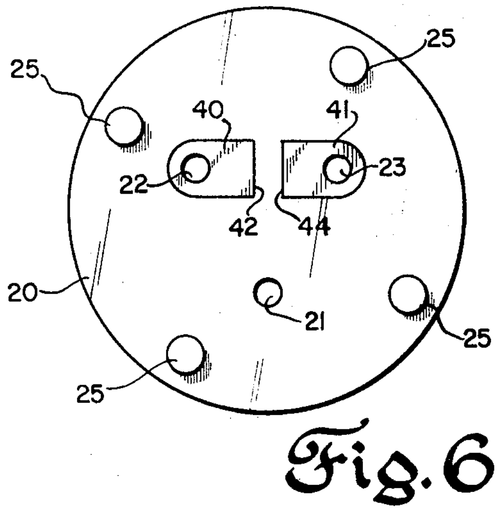
Fig.5 Fig.6

PROTECTIVE ELECTRICAL FEED-THROUGH ASSEMBLIES FOR ENCLOSURES FOR ELECTRICAL DEVICES

The present invention relates in general to protective pads and in particular to such pads useful as mounting pads and conductive shunts with electrical devices such as semiconductor devices.

Mounting pads made of a plastic insulating material and used for positioning the leads of a device such as a semiconductor device for proper insertion in a circuit board are known. Such pads provide solder isolation and to some extent improve the thermal conductivity between the semiconductor device and the circuit board.

An object of the present invention is to provide a mounting pad which not only provides the usual functions enumerated above but which also provides electrical surge protection for the device as well as improved thermal conductivity for heat generated in the device.

Conductive shunts made of a high current conductivity material, usually with linear characteristics, are also commonly used to protect semiconductor devices, such as MOS/FET's from stray electrical fields during shipment, but are required to be removed for installation and thus are not available either during this critical operation or subsequently in the field.

Another object of the present invention is to provide a mounting pad which also may be used as a conductive shunt for the purposes enumerated above.

Another object of the present invention is to provide a conductive shunt which may be maintained permanently attached to the semiconductor device during shipment and installation and during the latter operation provide the function of a mounting pad which not only provides the usual functions of solder isolation and improved thermal conductivity but also provides surge protection in the circuits in which the device is used.

In carrying out the present invention in one illustrative embodiment thereof as applied to semiconductor devices, there is provided a wafer of metallic oxide varistor material having a pair of opposed surfaces. A plurality of apertures are provided in the wafer each extending through the wafer from one opposed surface to the other opposed surface thereof. Each of the apertures is adapted to receive a respective conductive electrode of the semiconductor device and provide conductive contact between each of the electrodes and the wafer. The wafer is constituted of a metal oxide varistor material having an alpha in excess 10 in the current density range of $10^{-3}$ to $10^{2}$ amperes per square centimeter. The portions of a pair of apertures of the wafer in contact with the electrodes are spaced to provide a high impedance between a pair of electrodes insertable therein when normal operating voltages appear across the electrodes and when voltages progressively in excess of normal voltage appear thereacross a rapidly decreasing impedance is presented by the wafer in accordance with the alpha of the material of the wafer thereby limiting the voltage appearing between the pair of electrodes.

The novel features which are believed to be characteristic of the present invention are set forth in appended claims. The invention itself, however, together with further objects and advantages thereof may best be understood by reference to the following description taken in connection with the accompanying drawings wherein:

FIG. 1 is a perspective view of a mounting pad, a semiconductor device and a circuit board showing the manner in which the mounting pad is cooperatively associated with the semiconductor device and with the circuit board.

FIG. 2 is a side view of the mounting pad of FIG. 1 taken along section lines 2—2 thereof.

FIG. 3 shows graphs of the electrical characteristics of three materials of different voltage gradients and alphas suitable for utilization in the mounting pad devices of the present invention.

FIG. 4 is a side view of a mounting pad in accordance with another embodiment of the invention.

FIG. 5 is a top view of the embodiment of FIG. 4.

FIG. 6 is a bottom view of the embodiment of FIG. 4.

Referring now to FIG. 1, there is shown a semiconductor device 16 having three leads 17, 18 and 19 or electrodes by me,ns of which the device is to be attached to three conductors 11, 12 and 13 on the surface of a circuit board 10. Also shown is a mounting pad 20 in accordance with the present invention. The mounting pad 20 or wafer has a pair of opposed surfaces and has three apertures 21, 22 and 23 of circular cross section, each extending from one major face and the other major face thereof. The center-to-center spacing of a pair of circular apertures may be identical to the center-to-center spacing of a corresponding pair of leads of the semiconductor device or may be different, particularly when the pad is providing an adaptive function between the device and the circuit board. The apertures 21, 22 and 23 are of a size which provide good conductive contact between each of the leads and the wafer 20. Four projections 25 equally spaced about the periphery of the upper surface of the wafer 20 are provided and similarly four projections are equally spaced about the periphery of the lower surface of the wafer 20 for suitably spacing the mounting pad from the semiconductor device 16 and from the circuit board 10. Each of the conductors 11, 12 and 13 have a circular center-to-center spacing corresponding to the center-to-center spacing of the holes or apertures in the wafer 20 so that the leads may be readily inserted therein with the mounting pad separating the semiconductor device from the circuit board. The mounting pad provides a function of limiting the solder flow to the regions in the vicinity of the conductors and avoiding short circuits during the attachment of the electrodes of the semiconductor device to the circuit board.

In accordance with the present invention, the material of the pad 20 is constituted of a metal oxide varistor material which has a particular characteristic of rendering it suitable for use as a surge protection device as well as providing a high conductivity path of heat flow from the device 16 to the conductors 11, 12 and 13 and to the mounting board or substrate on which the conductors are located. Suitable metal oxide varistor materials are described in Canadian patent No. 831,691. The metal oxide varistor material described in the aforementioned patent is constituted of fine particles of zinc oxide with certain additives which have been pressed and sintered at high temperatures to provide a composite body or wafer of material. The current versus voltage characteristics of the composite body is expressed by the following equation:

$$I = (V/C)^{\alpha} \quad , \qquad (1)$$

where

V is voltage applied across a pair of opposed surfaces or planes,

I is the current which flows between the surfaces,

C is a constant which is a function of the physical dimensions of the body as well as its composition and the process used in making it, $\alpha$ is a constant for a given range of current and is a measure of the nonlinearity of the current versus voltage characteristic of the body.

In equation (1), when V is used to denote voltage between opposed planes of a unit volume of material, or voltage gradient, current flow through the unit volume of material in response to the voltage gradient becomes current density. For the metal oxide varistor material for current densities which are very low, for example, in the vicinity of a microampere per square centimeter, the alpha ($\alpha$) is relatively low, i.e., less than 10. In the current density range of from $10^{-3}$ to $10^{2}$ amperes per square centimeter, the alpha is high, i.e., substantially greater than 10 and relatively constant. In the current density ranges progressively in excess of $10^{2}$ amperes per square centimeter, the alpha progressively decreases. When the current versus voltage characteristic is plotted on log-log coordinates, the alpha is represented by the reciprocal of the slope of the graph in which current density is represented by the abscissa and voltage gradient is represented by the ordinate of the graph. For a central range of current densities of from $10^{-3}$ to $10^{2}$ amperes per square centimeter, the reciprocal of the slope is relatively constant. For current densities below this range, the reciprocal of the slope of the graph progressively decreases. Also for current densities above this range, the reciprocal of the slope of the graph progressively decreases.

The voltage gradient versus current density characteristics of three types of material in log-log coordinates are set forth in FIG. 3. Graphs 30 and 31 are materials of high voltage gradient material and graph 32 is a graph of low voltage gradient material. For all of the graphs in the current density range from $10^{-3}$ to $10^{2}$ amperes per square centimeter, the alpha is high and is substantially greater than 10 and relatively constant. For current densities progressively greater than $10^{2}$ amperes per square centimeter, the alpha progressively decreases. For current densities progressively less than $10^{-3}$ per square centimeter, the alpha also progressively decreases.

As the metal oxide varistor material is a ceramic material, the surfaces thereof may be metallized for facilitating electrical connections thereto in a manner similar to the manner in which other ceramic materials are metallized. For example, Silver Glass Frit, Du Pont No. 7713, made by the Du Pont Chemical Company of Wilmington, Delaware, may be used. Such material is applied as a slurry in a silk screening operation and fired at about 550°C to provide a conductive coating on the surface. Other methods such as electroplating or metal spraying could be used as well.

The nonlinear characteristics of the material results from bulk phenomenon and is bi-directional. The response of the material to steep voltage wave fronts is very rapid. Accordingly, the voltage limiting effect of the material is practically instantaneous. Heat generation occurs throughout the body of material and does not occur in specific regions thereof as in semiconductor junction devices, for example. Accordingly, the material has good heat absorption capability as the conversion of electrical to thermal energy occurs throughout the material. The specific heat of the material is 0.12 calories per degree Centigrade per gram. Accordingly, on this account, as well, heat absorption capability of the material is advantageous as a surge absorption material. The heat conductivity of the material is about one-half the heat conductivity of alumina. Accordingly, any heat generated in the material may be rapidly conducted from the material into appropriate heat sinks.

The material, in addition to the desired electrical and thermal characteristics described above, has highly desirable mechanical properties. The material has a fine grain structure, may be readily machined to a smooth surface and formed into any desired shape having excellent compressive strength. The material is readily molded in the process of making it. Accordingly, any size or shape of material may be readily formed for the purposes desired.

Accordingly, a pad is provided which provides a plurality of functions in connection with electrical devices. During the manufacture and shipment of the electrical devices, the pads may be applied to the leads of the devices to protect the devices from spurious and stray electric fields. During the installation of the devices in a circuit board, the pads provide solder isolation for the leads. During the use of the devices in operative circuits, the pads provide electrical surge to the devices as well as improved heat conduction therefrom.

Reference is now made to FIGS. 4, 5 and 6 which show another embodiment in accordance with the present invention, which is similar to the embodiment of FIG. 5, with the additional provision of a plurality of conductive layers or strips secured to the opposed surfaces of the metal oxide varistor body or wafer to enable greater flexibility to be achieved with respect to the voltage versus current characteristics between any pair of conducting electrodes. The elements of FIGS. 4, 5 and 6, identical to the elements of FIG. 2, are designated by the same numerals. In these figures, the metal oxide varistor wafer 20 has applied to one surface a pair of conductive strips 40 and 41, first strip 40 extending from the aperture 22 and terminating in a straight edge 42 and a second strip 41 extending from the aperture 23 also terminating in a straight edge 44 to form a gap with the first strip. The separation of the adjacent straight edges 42 and 44 of the strips 40 and 41 is set to provide the desired voltage versus current characteristic between the strips which limits the amplitude of transient voltage surges which may appear across the apertures 22 and 23. The opposite surface of the wafer is also provided with metal strips. Metal strip 45 is in conductive contact with the aperture 22, extends a distance therefrom and terminates in a straight edge 46. Similarly, a conductive strip 47 extends from the aperture 21 along a straight line between aperture 21 and aperture 22 and terminates in a straight edge 48 intermediate the distance between the two leads to form a gap with straight edge 46. Conductive strip 50 extends from the aperture 21, extends a distance toward aperture 23 and terminates in a straight edge 51.

Similarly, strip 52 extends from aperture 23 and terminates in a straight edge 53 to form a gap therewith. The spacing of strips 45 and 47 is arranged to provide the desired voltage versus current characteristic between the apertures 21 and 22 which limits the amplitude of transient voltage surges which may appear across apertures 21 and 22. Similarly, the gap between strips 50 and 52 is arranged to provide a desired voltage versus current characteristic between the apertures 21 and 22. Metal oxide varistor structures utilizing laterally spaced electrodes are also described and claimed in my copending patent application, Ser. No. 165,001, Metal Oxide Varistor with Laterally Spaced Electrodes, filed July 22, 1971, and assigned to the assignee of the present application.

In the case of the wafer of metal oxide varistor material, holes are machined into the material of appropriate size to receive and provide good conduction with the leads or electrodes of an electrical device. If desired, the interior regions of the holes may be metallized by one of the processes described above to improve and assure good conductive contact between the conductive strips, the leads, and the wafer of metal oxide varistor material.

While the invention has been described in specific embodiments, it will be appreciated that modifications may be made by those skilled in the art and I intend by the appended claims to cover all such modifications as fall within the true spirit and scope of the inventions.

What I claim as new and desire to secure by Letters Patent of the United States is:

1. A protective pad for use with electrical devices comprising:

a wafer of metallic oxide varistor material having a pair of opposed surfaces, a plurality of apertures in said wafer, each extending through said wafer from one opposed surface thereof, each of said apertures adapted to receive a respective conductive electrode of an electrical device and provide conductive contact of each of said electrodes with said wafer, said material having an essentially constant alpha in excess of 10 in the current density range of $10^{-3}$ to $10^2$ per square centimeter, the portions of said apertures of said wafer in contact with said electrodes being spaced to provide a current flow between a pair of electrodes which is low when normal operating voltage appears across said pair of electrodes and when voltages in excess of normal voltage appears thereacross rapidly decreasing impedance is presented by said wafer in accordance with the alpha of the material of the body thereby limiting the voltage appearing between said pair of electrodes.

2. The combination of claim 1 in which one of said surfaces is provided with a pair of spaced conductive layers, each in conductive contact with a respective one of a pair of said electrodes, the distance between said layers along said one surface being set to obtain a desired normal operating point on the voltage versus current graph of one pair of electrodes.

3. The combination of claim 2 in which the other of said surfaces is provided with another pair of spaced conductive layers, each in conductive contact with a respective one of another pair of said electrodes, the distance between said other pair of layers along said other surface being set to obtain a desired normal operating point on the voltage versus current graphs of said other pair of electrodes.

4. In combination, a wafer of metallic oxide varistor material having a pair of opposed surfaces, a plurality of apertures in said wafer, each extending through said wafer from one opposed surface to the other opposed surface thereof, an electrical device having a plurality of electrodes, each of said electrodes extending through a respective one of said apertures and in conductive contact therewith, said material having an alpha in excess of 10 in the current density range of $10^{-3}$ to $10^2$ amperes per square centimeter, the portions of said apertures of said wafer in contact with said electrodes being spaced to provide a current flow between a pair of electrodes which is low when normal operating voltage appears across said pair of electrodes and when voltages in excess of normal voltage appears thereacross rapidly decreasing impedance is presented by said wafer in accordance with the alpha of the material of the body thereby limiting the voltage appearing between said pair of electrodes.

* * * * *

PO-1050
(5/69)

UNITED STATES PATENT OFFICE
CERTIFICATE OF CORRECTION

Patent No. 3,742,420 Dated June 26, 1973

Inventor(s) John D. Harnden, Jr.

It is certified that error appears in the above-identified patent and that said Letters Patent are hereby corrected as shown below:

On the first page, between Item [76] and Item [22]

Insert

[73] Assignee: General Electric Company

Signed and sealed this 17th day of September 1974.

(SEAL)
Attest:

McCOY M. GIBSON JR.
Attesting Officer

C. MARSHALL DANN
Commissioner of Patents